United States Patent
Dhaundiyal

(10) Patent No.: US 9,294,853 B1
(45) Date of Patent: Mar. 22, 2016

(54) AUDIO CONTROL PROCESS

(71) Applicant: Google Inc., Mountain View, CA (US)

(72) Inventor: Rahul Dhaundiyal, Nodia (IN)

(73) Assignee: Google Inc., Mountain View, CA (US)

( * ) Notice: Subject to any disclaimer, the term of this patent is extended or adjusted under 35 U.S.C. 154(b) by 258 days.

(21) Appl. No.: 13/730,088

(22) Filed: Dec. 28, 2012

(51) Int. Cl.
*H03G 3/00* (2006.01)
*H04R 29/00* (2006.01)
*H04R 25/00* (2006.01)

(52) U.S. Cl.
CPC ..................... *H04R 29/00* (2013.01)

(58) Field of Classification Search
CPC . H04R 29/00; G06F 3/0481; G06F 17/30899; G06F 17/30905; G06F 3/0236; G06F 3/04812; G06F 3/04817; G06F 3/0482; G06F 3/04892; G09G 2370/027; H04L 67/34; H04N 21/4396; H04N 21/4438; H04N 21/4782; H04N 21/4852; H04N 21/8113
USPC ............. 381/104, 56; 345/156; 715/800, 830, 715/727, 763, 833
See application file for complete search history.

(56) References Cited

U.S. PATENT DOCUMENTS

| | | | |
|---|---|---|---|
| 8,289,688 B2 | 10/2012 | Behar et al. | |
| 2008/0025529 A1* | 1/2008 | Keohane et al. | 381/104 |
| 2008/0187149 A1 | 8/2008 | Jung | |
| 2011/0225492 A1 | 9/2011 | Boettcher et al. | |

FOREIGN PATENT DOCUMENTS

EP         1587230         10/2005

OTHER PUBLICATIONS

International Search Report and Written Opinion for PCT Application No. PCT/US2013/077470; dated Apr. 16, 2014, 12 pages.

* cited by examiner

*Primary Examiner* — Paul S Kim
*Assistant Examiner* — Norman Yu
(74) *Attorney, Agent, or Firm* — Patent Law Works LLP

(57) ABSTRACT

Implementations described herein may include activating an audio source associated with a graphical user interface, the audio source having an initial location associated with the graphical user interface. Some implementations may further include sensing a displacement of the audio source with respect to the initial location and determining that the displacement of the audio source exceeds a predetermined threshold. In some implementations, in response to determining that the displacement of the audio source exceeds a predetermined threshold, the process may include adjusting a level of audio associated with the audio source.

20 Claims, 5 Drawing Sheets

AUDIO CONTROL PROCESS

BACKGROUND

Some social networking applications may generate a large quantity of data within the associated graphical user interface (e.g. in their feed, stream, etc.). Often, users may play audio/video in the graphical user interface, and then scroll away to a different portion of the interface without waiting for the playing content to finish.

SUMMARY

In one implementation, a method, in accordance with this disclosure, may include activating an audio source associated with a graphical user interface, the audio source having an initial location associated with the graphical user interface. Some implementations may further include sensing a displacement of the audio source with respect to the initial location and determining that the displacement of the audio source exceeds a predetermined threshold. In some implementations, in response to determining that the displacement of the audio source exceeds a predetermined threshold, the process may include adjusting a level of audio associated with the audio source.

One or more of the following features may be included. In some implementations, adjusting the level of audio may include reducing the audio level as the displacement increases. Some implementations may further include determining that the audio source is in a second location associated with the graphical user interface. In some implementations adjusting the audio level may be based upon, at least in part, a displacement from the second location. In some implementations, the displacement of the audio source may be based upon, at least in part, a scrolling operation. In some implementations the graphical user interface may be associated with a social network. Some implementations may include muting the audio source if the displacement of the audio source exceeds a second predetermined threshold.

In another implementation, a computer program product residing on a computer readable storage medium having a plurality of instructions stored thereon is provided. In some implementations, the instructions, which when executed by a processor, cause the processor to perform one or more operations. Some operations may include activating an audio source associated with a graphical user interface, the audio source having an initial location associated with the graphical user interface. Operations may further include sensing a displacement of the audio source with respect to the initial location and determining that the displacement of the audio source exceeds a predetermined threshold. In some implementations, in response to determining that the displacement of the audio source exceeds a predetermined threshold, operations may include adjusting a level of audio associated with the audio source.

One or more of the following features may be included. In some implementations, adjusting the level of audio may include reducing the audio level as the displacement increases. Operations may further include determining that the audio source is in a second location associated with the graphical user interface. In some implementations adjusting the audio level may be based upon, at least in part, a displacement from the second location. In some implementations, the displacement of the audio source may be based upon, at least in part, a scrolling operation. In some implementations the graphical user interface may be associated with a social network. Operations may include muting the audio source if the displacement of the audio source exceeds a second predetermined threshold.

In another implementation, a computing system is provided. In some implementations, the computing system may include one or more processors configured to activate an audio source associated with a graphical user interface, the audio source having an initial location associated with the graphical user interface. Some implementations may further include sensing a displacement of the audio source with respect to the initial location and determining that the displacement of the audio source exceeds a predetermined threshold. In some implementations, in response to determining that the displacement of the audio source exceeds a predetermined threshold, the one or more processors may be further configured to adjust a level of audio associated with the audio source.

One or more of the following features may be included. In some implementations, adjusting the level of audio may include reducing the audio level as the displacement increases. Some implementations may further include determining that the audio source is in a second location associated with the graphical user interface. In some implementations adjusting the audio level may be based upon, at least in part, a displacement from the second location. In some implementations, the displacement of the audio source may be based upon, at least in part, a scrolling operation. In some implementations the graphical user interface may be associated with a social network. Some implementations may include muting the audio source if the displacement of the audio source exceeds a second predetermined threshold.

The details of one or more implementations are set forth in the accompanying drawings and the description below. These and other implementations may provide one or more advantages as discussed in further detail below.

Implementations of the audio control process disclosed herein may provide numerous advantages over previous solutions. Accordingly, the audio control process may be used to enhance the user experience when engaging with audio sources, for example, those associated with embedded videos in a web page, whose position can be altered by scrolling. Some social networking applications may generate a large quantity of data in their feeds/streams. It is commonplace for users to play audio/video in their streams, and then scroll away to a different portion of the stream without waiting for the playing content to finish.

In some implementations, the audio control process disclosed herein may be configured to adjust the audio volume as the user scrolls away from and/or towards the source (e.g. an audio player, video player, etc). Accordingly, implementations disclosed herein may be used to adjust the audio level depending on how far the user has scrolled away from it (e.g., the farther the user has scrolled, the dimmer the audio may get). For example, if the application can suitably relate 'user interest' to 'distance scrolled' (farther the distance, lower the interest), then the audio/video may be muted if the user has scrolled 'too far' away. Additionally and/or alternatively, if there is too much data in the stream, it may be difficult to locate audio source once the user has scrolled away from it. A variable audio volume may act as a hint of source's location (e.g., audio gets louder as the user scrolls towards the source).

BRIEF DESCRIPTION OF THE DRAWINGS

Like reference symbols in the various drawings may indicate like elements.

DETAILED DESCRIPTION

Figure 1:
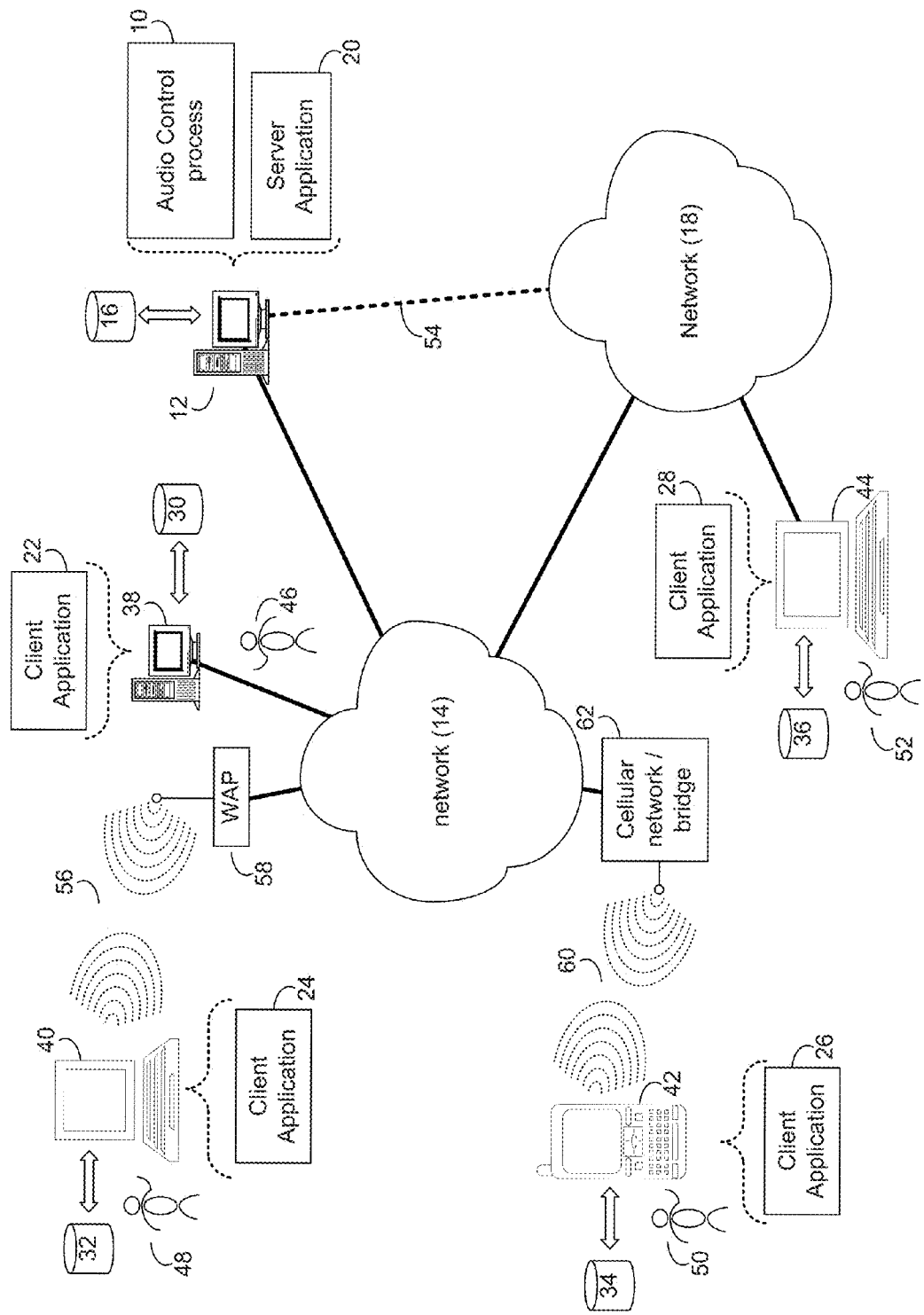
FIG. 1 is a diagrammatic view of a audio control process in accordance with an implementation of the present disclosure.
Figure 2:
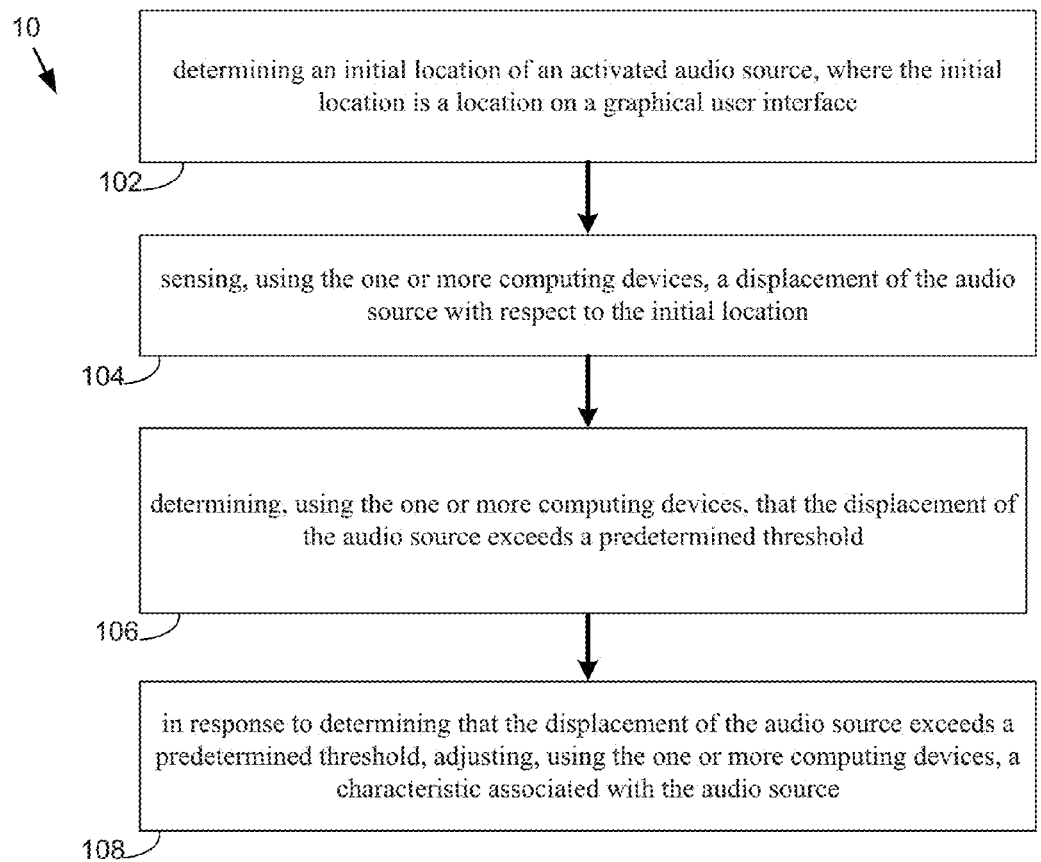
FIG. 2 is a flowchart of the audio control process of FIG. 1 in accordance with an implementation of the present disclosure.
Figure 3:
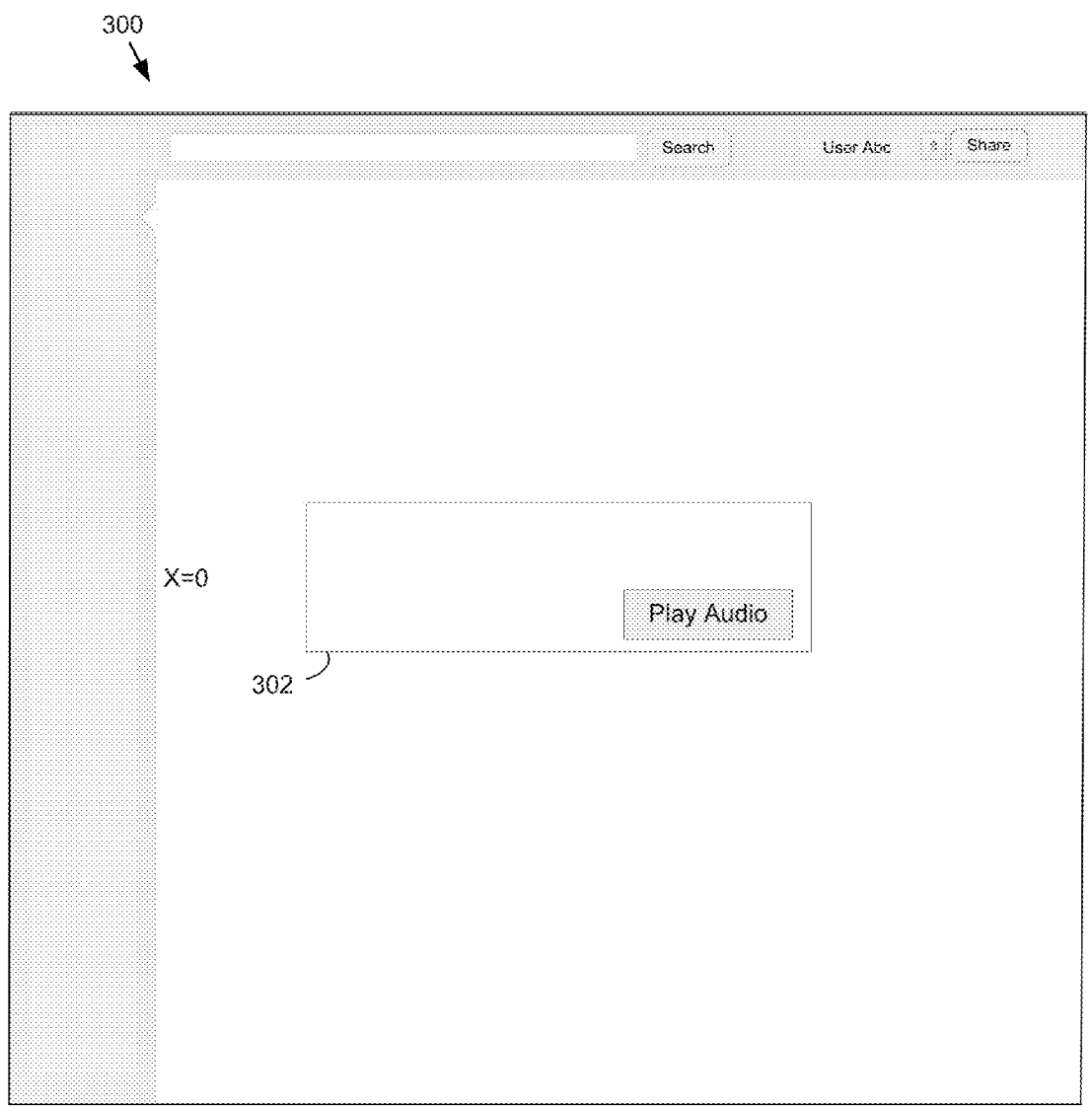
FIG. 3 is a graphical user interface associated with the audio control process of FIG. 1 in accordance with an implementation of the present disclosure.

Referring to FIGS. 1-3, there is shown an audio control process 10 that may reside on and may be executed by computer 12, which may be connected to network 14 (e.g., the Internet or a local area network). Server application may include some or all of the elements of audio control process 10 described herein. Examples of computer 12 may include but are not limited to a single server computer, a series of server computers, a single personal computer, a series of personal computers, a mini computer, a mainframe computer, an electronic mail server, a social network server, a text message server, a photo server, or a computing cloud. The various components of computer 12 may execute one or more operating systems.

As will be discussed below in greater detail, audio control process 10 may include activating (102) using one or more computing devices, an audio source associated with a graphical user interface, the audio source having an initial location associated with the graphical user interface. Audio control process 10 may further include sensing (104) using the one or more computing devices, a displacement of the audio source with respect to the initial location. Audio control process 10 may also be configured to determine (106), using the one or more computing devices, that the displacement of the audio source exceeds a predetermined threshold. In response to determining that the displacement of the audio source exceeds a predetermined threshold, audio control process 10 may include adjusting (108), using the one or more computing devices, a level of audio associated with the audio source.

The instruction sets and subroutines of audio control process 10, which may be stored on storage device 16 coupled to computer 12, may be executed by one or more processors (not shown) and one or more memory architectures (not shown) included within computer 12. Storage device 16 may include but is not limited to: a hard disk drive; a flash drive, a tape drive; an optical drive; a RAID array; a random access memory (RAM); and a read-only memory (ROM).

Network 14 may be connected to one or more secondary networks (e.g., network 18), examples of which may include but are not limited to: a local area network; a wide area network; or an intranet, for example.

Audio control process 10 may be accessed via client applications 22, 24, 26, 28. Examples of client applications 22, 24, 26, 28 may include but are not limited to a standard web browser, a customized web browser, or a custom application. The instruction sets and subroutines of client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory architectures (not shown) incorporated into client electronic devices 38, 40, 42, 44 (respectively).

Storage devices 30, 32, 34, 36 may include but are not limited to: hard disk drives; flash drives, tape drives; optical drives; RAID arrays; random access memories (RAM); and read-only memories (ROM). Examples of client electronic devices 38, 40, 42, 44 may include, but are not limited to, personal computer 38, laptop computer 40, smart phone 42, notebook computer 44, a server (not shown), a data-enabled, cellular telephone (not shown), a television with one or more processors embedded therein or coupled thereto, and a dedicated network device (not shown).

One or more of client applications 22, 24, 26, 28 may be configured to effectuate some or all of the functionality of audio control process 10. Accordingly, audio control process 10 may be a purely server-side application, a purely client-side application, or a hybrid server-side/client-side application that is cooperatively executed by one or more of client applications 22, 24, 26, 28 and audio control process 10.

Users 46, 48, 50, 52 may access computer 12 and audio control process 10 directly through network 14 or through secondary network 18. Further, computer 12 may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 56 established between laptop computer 40 and wireless access point (i.e., WAP) 58, which is shown directly coupled to network 14. WAP 58 may be, for example, an IEEE 802.11a, 802.11b, 802.11g, Wi-Fi, and/or Bluetooth device that is capable of establishing wireless communication channel 56 between laptop computer 40 and WAP 58. Smart phone 42 is shown wirelessly coupled to network 14 via wireless communication channel 60 established between smart phone 42 and cellular network/bridge 62, which is shown directly coupled to network 14.

All of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. Bluetooth is a telecommunications industry specification that allows e.g., mobile phones, computers, and smart phones to be interconnected using a short-range wireless connection. Client electronic devices 38, 40, 42, 44 may each execute an operating system.

A number of users 46, 48, 50, and 52 of the client devices 38, 40, 42, 44, respectively, may access the server device 12 to participate in a social networking service. For example, the client devices 38, 40, 42, 44 can execute web browser applications that can be used to access the social networking service. In another example, the client devices 38, 40, 42, 44 may execute software applications that are specific to the social network (e.g., social networking "apps" running on smartphones).

The users 46, 48, 50, and 52 may participate in the social networking service provided by server device 12 by posting information, such as text comments (e.g., updates, announcements, replies), digital photos, videos, or other appropriate electronic information. In some implementations, information can be posted on a user's behalf by systems and/or services external to the social network or the server device 12. For example, the user 46 may post an audio clip on one website, and with proper permissions that website may cross-post the audio clip to the social network on the user's 46 behalf. In another example, a software application executing on a mobile device, with proper permissions, may use global positioning system (GPS) capabilities to determine the user's location and automatically update the social network with his location (e.g., "At Home", "At Work", etc.).

As discussed above, one or more of users 46, 48, 50, 52 may access computer 12 and audio control process 10 through network 14 or secondary network 18. For example, and for illustrative purposes only, assume that user 46 (i.e., the user of personal computer 38) wishes to use audio control process 10. User 46 may access audio control process 10 through client application 22 associated with personal computer 38. In this way, audio control process 10 may operate as a standalone application or alternatively as an applet or plug-in operating within a separate program such as server application 20. In some implementations, server application 20 may include a social networking application. Although, this particular example focuses upon user 46 and personal computer 38 it should be noted that this disclosure is not meant to be limited to this particular example as laptop computer 40, smart phone 42, notebook computer 44, etc., may also be used to access and/or render some or all of the implementations of audio control process 10 described herein.

In some implementations, audio control process 10 may be used to enhance the user experience when engaging with audio sources, for example, those associated with embedded videos in a web page, whose position can be altered by scrolling. Some social networking applications may generate a large quantity of data in their feeds/streams. It is commonplace for users to play audio/video in their streams, and then scroll away to a different portion of the stream without waiting for the playing content to finish.

In some implementations, audio control process 10 may be configured to adjust the audio volume as the user scrolls away from and/or towards the source (e.g. an audio player, video player, etc). Accordingly, audio control process 10 may be used to adjust the audio level depending on how far the user has scrolled away from the source (e.g., the farther the user has scrolled, the dimmer the audio may get).

Additionally and/or alternatively, audio control process 10 may be configured to relate 'user interest' to 'distance scrolled' (e.g., the farther the distance scrolled, the lower the interest in the audio). Accordingly, audio control process 10 may be configured to mute the audio and/or video if the user has scrolled beyond a certain threshold distance. Additionally and/or alternatively, if a particular user interface contains a large quantity of information (e.g. a lengthy stream, feed, etc.) it may be difficult to locate the audio source once the user has scrolled away from it. In this way, the variable audio volume associated with audio control process 10 may act as a hint of the source's location (e.g., audio may increase as the user scrolls towards the source).

Referring now to FIG. 3, an implementation of a graphical user interface 300 rendered in accordance with audio control process 10 is provided. Graphical user interface 300 may be associated with a social networking application and may be configured to display content, which may include but is not limited to, text, audio, video, photographs, commentary, etc. In some implementations, user control process 10 may include activating (102) an audio source 302 associated with graphical user interface 300. The audio source may be provided using any suitable technique, for example, as an audio or video player provided by the social networking application. In some implementations, audio source 302 may include an initial location (e.g. X=0) associated with graphical user interface 300. Activation of audio source 302 may occur upon selection by a user (e.g. user 46 may access graphical user interface 300 using client application 22 associated with computing device 36).

Figure 4:
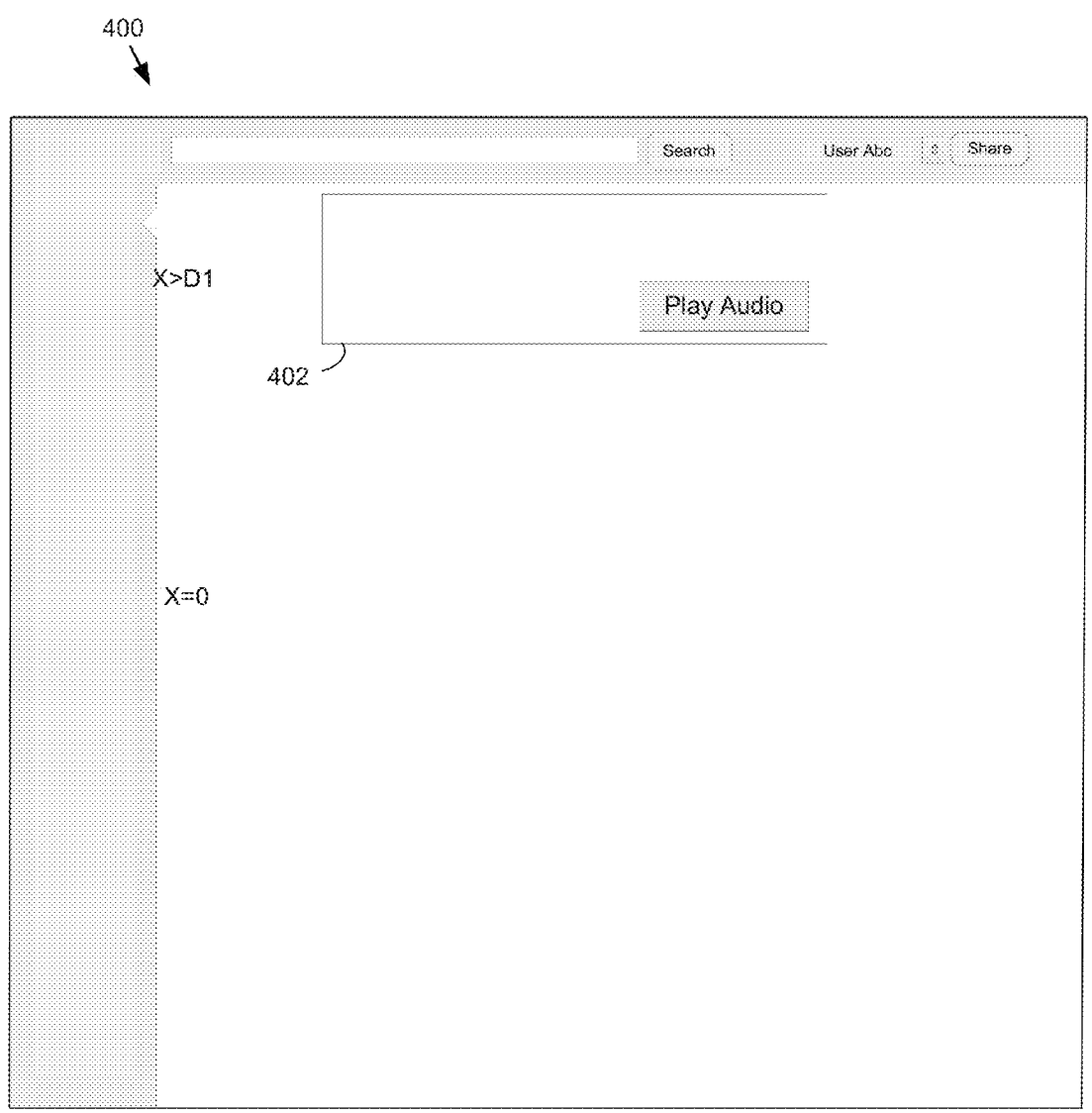
FIG. 4 is a graphical user interface associated with the audio control process of FIG. 1 in accordance with an implementation of the present disclosure.

In some implementations, user control process 10 may include sensing (104) a displacement of audio source 302 with respect to the initial location (e.g. X=0). As shown in FIG. 4, graphical user interface 400 depicts an example where a user has scrolled, or otherwise moved, from the initial location (X=0). In this particular example, the user has shifted his/her attention to a different portion of the graphical user interface 400. As a result, audio source 402 is shown now at the top of the graphical user interface 400. User control process 10 may utilize a predetermined threshold (e.g. D1) in order to determine when it may be appropriate to adjust the audio of a particular audio source (e.g. audio source 402).

Accordingly, in some implementations, user control process 10 may be configured to determine (106) that the displacement of audio source 402 exceeds the predetermined threshold, D1. In the example shown in FIG. 4, audio source 402 has been displaced from its initial position to a second position, which exceeds the predetermined threshold D1.

In some implementations, in response to determining that the displacement of audio source 402 exceeds the predetermined threshold D1, audio control process 10 may be configured to adjust (108) a level of audio associated with audio source 402. In some implementations, adjusting the level of audio may include reducing the audio level as the displacement increases. Additionally and/or alternatively, adjusting the level of audio may include increasing the audio level as the displacement decreases.

In some implementations, user control process 10 may be configured to determine that the audio source is in a second location (e.g. X=D2) associated with the graphical user interface. User control process 10 may be further configured to adjust the audio level based upon, at least in part, a displacement from the second location (e.g. X>D2). Accordingly, user control process 10 may be configured to mute the audio source 302, 402 if the displacement of the audio source exceeds a second predetermined threshold (e.g. D2).

Figure 5:
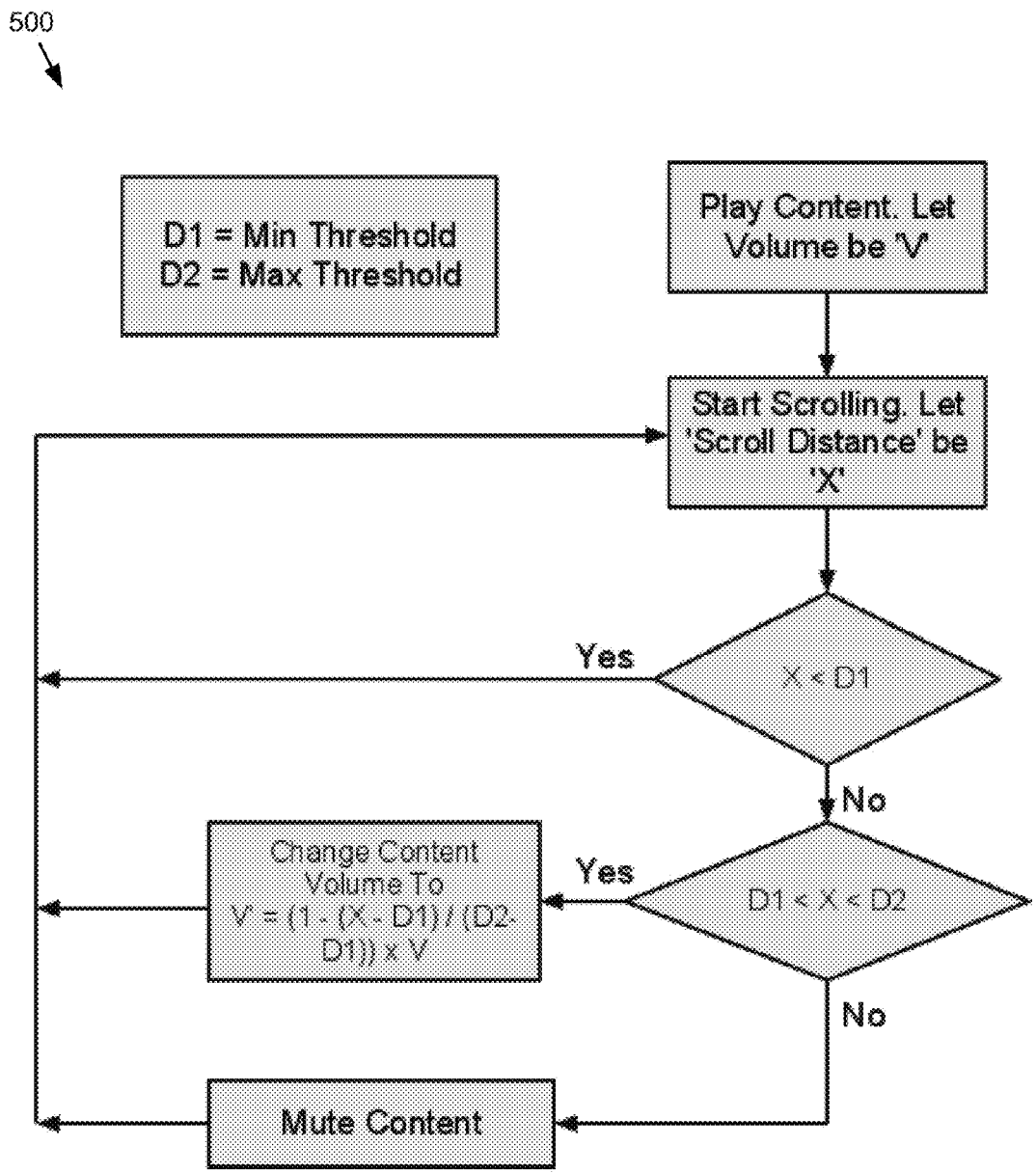
FIG. 5 is a flowchart of the audio control process of FIG. 1 in accordance with an implementation of the present disclosure.

Referring now to FIG. 5, an example of a flowchart 500 consistent with one implementation of user control process 10 is provided. As shown in FIG. 5, and as discussed above, D1 may refer to a minimum threshold and D2 may refer to a maximum threshold. Scroll distance is shown in the FIG. 5 as X. It should be noted that while the term "scrolling" is meant to refer to any displacement of the audio source either with reference to the graphical user interface or any perceptible movement of the audio source which may be decipherable from the vantagepoint of the user.

As will be appreciated by one skilled in the art, the present disclosure may be embodied as a method, system, or computer program product. Accordingly, the present disclosure may take the form of an entirely hardware implementation, an entirely software implementation (including firmware, resident software, micro-code, etc.) or an implementation combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described with reference to flowchart illustrations and/or block diagrams of methods, apparatus (systems) and computer program products according to implementations of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The flowchart and block diagrams in the figures illustrate the architecture, functionality, and operation of possible implementations of systems, methods and computer program products according to various implementations of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular implementations only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The implementation was chosen and described in order to best explain the principles of the disclosure and the practical application, and to enable others of ordinary skill in the art to understand the disclosure for various implementations with various modifications as are suited to the particular use contemplated.

Having thus described the disclosure of the present application in detail and by reference to implementations thereof, it will be apparent that modifications and variations are possible without departing from the scope of the disclosure defined in the appended claims.

What is claimed is:

1. A computer-implemented method comprising:
   sensing, using the one or more computing devices, a displacement of an audio source associated with a graphical user interface with respect to an initial location within the graphical user interface;
   determining, using the one or more computing devices, that the displacement of the audio source exceeds a first predetermined threshold distance within a displayable area of the graphical user interface;

in response to determining that the displacement of the audio source exceeds the first predetermined threshold distance, turning on, using the one or more computing devices, audio associated with the audio source;

determining, using the one or more computing devices, that the displacement of the audio source exceeds a second predetermined threshold distance within the displayable area of the graphical user interface; and in response to determining that the displacement of the audio source exceeds the second predetermined threshold distance, turning off, using the one or more computing devices, the audio associated with the audio source.

2. The computer-implemented method of claim 1, further comprising adjusting a level of audio by reducing the audio level as the displacement increases.

3. The computer-implemented method of claim 1, further comprising:

determining that the audio source is in a second location associated with the graphical user interface.

4. The computer-implemented method of claim 3, further comprising:

adjusting an audio level based upon, at least in part, a displacement from the second location.

5. The computer-implemented method of claim 1, wherein the displacement of the audio source is based upon, at least in part, a scrolling operation.

6. The computer-implemented method of claim 1, wherein the graphical user interface is associated with a social network.

7. The computer-implemented method of claim 1, further comprising:

muting the audio source if the displacement of the audio source exceeds a second predetermined threshold.

8. A non-transitory computer readable medium having stored thereon instructions that when executed by a processor perform one or more operations, the operations comprising:

sensing, using the one or more computing devices, a displacement of an audio source associated with a graphical user interface with respect to an initial location within the graphical user interface;

determining, using the one or more computing devices, that the displacement of the audio source exceeds a first predetermined threshold distance within a displayable area of the graphical user interface;

in response to determining that the displacement of the audio source exceeds the first predetermined threshold distance, turning on, using the one or more computing devices, audio associated with the audio source;

determining, using the one or more computing devices, that the displacement of the audio source exceeds a second predetermined threshold distance within the displayable area of the graphical user interface; and in response to determining that the displacement of the audio source exceeds the second predetermined threshold distance, turning off, using the one or more computing devices, the audio associated with the audio source.

9. The non-transitory computer readable medium of claim 8, further comprising adjusting a level of audio by reducing the audio level as the displacement increases.

10. The non-transitory computer readable medium of claim 8, further comprising:

determining that the audio source is in a second location associated with the graphical user interface.

11. The non-transitory computer readable medium of claim 10, further comprising:

adjusting an audio level based upon, at least in part, a displacement from the second location.

12. The non-transitory computer readable medium of claim 8, wherein the displacement of the audio source is based upon, at least in part, a scrolling operation.

13. The non-transitory computer readable medium of claim 8, wherein the graphical user interface is associated with a social network.

14. The non-transitory computer readable medium of claim 8, further comprising:

muting the audio source if the displacement of the audio source exceeds a second predetermined threshold.

15. A computing system, comprising:

one or more processors configured to sense a displacement of an audio source associated with a graphical user interface with respect to an initial location within the graphical user interface, the one or more processors further configured to determine that the displacement of the audio source exceeds a first predetermined threshold distance within a displayable area of the graphical user interface, in response to determining that the displacement of the audio source exceeds the first predetermined threshold distance, the one or more processors further configured to turn on audio associated with the audio source, the one or more processors further configured to determine that the displacement of the audio source exceeds a second predetermined threshold distance within the displayable area of the graphical user interface and in response to determining that the displacement of the audio source exceeds the second predetermined threshold distance, the one or more processors further configured to turn off the audio associated with the audio source.

16. The computing system of claim 15, wherein the one or more processors are further configured to adjust a level of audio by reducing the audio level as the displacement increases.

17. The computing system of claim 15, wherein the one or more processors are further configured to determine that the audio source is in a second location associated with the graphical user interface.

18. The computing system of claim 17, wherein the one or more processors are further configured to adjust an audio level based upon, at least in part, a displacement from the second location.

19. The computing system of claim 15, wherein the displacement of the audio source is based upon, at least in part, a scrolling operation.

20. The computing system of claim 15, wherein the graphical user interface is associated with a social network.

* * * * *